United States Patent
Pehlke et al.

(10) Patent No.: US 9,838,058 B2
(45) Date of Patent: Dec. 5, 2017

(54) POWER AMPLIFICATION SYSTEM WITH VARIABLE SUPPLY VOLTAGE

(71) Applicant: SKYWORKS SOLUTIONS, INC., Woburn, MA (US)

(72) Inventors: David Richard Pehlke, Westlake Village, CA (US); David Steven Ripley, Marion, IA (US); Philip John Lehtola, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/867,192

(22) Filed: Sep. 28, 2015

(65) Prior Publication Data
US 2016/0241197 A1  Aug. 18, 2016

Related U.S. Application Data

(60) Provisional application No. 62/116,459, filed on Feb. 15, 2015.

(51) Int. Cl.
| | | |
|---|---|---|
| H04B 1/38 | (2015.01) | |
| H04B 1/3827 | (2015.01) | |
| H03F 3/21 | (2006.01) | |
| H03F 1/02 | (2006.01) | |
| H03F 3/191 | (2006.01) | |
| H03F 3/72 | (2006.01) | |
| H04B 1/04 | (2006.01) | |

(52) U.S. Cl.
CPC ......... *H04B 1/3833* (2013.01); *H03F 1/0227* (2013.01); *H03F 3/191* (2013.01); *H03F 3/211* (2013.01); *H03F 3/72* (2013.01); *H03F 2200/111* (2013.01); *H03F 2200/451* (2013.01); *H03F 2203/21106* (2013.01); *H03F 2203/7209* (2013.01); *H04B 2001/0408* (2013.01)

(58) Field of Classification Search
CPC .......... H03F 3/19; H03F 3/211; H04B 1/3833
USPC ..................... 455/571, 574, 127.3
See application file for complete search history.

(56) References Cited

U.S. PATENT DOCUMENTS

| | | | | |
|---|---|---|---|---|
| 4,961,032 A | * | 10/1990 | Rodriguez-Cavazos | H03F 1/0244 315/395 |
| 8,461,931 B1 | * | 6/2013 | Bayruns | H03F 1/0244 330/127 |
| 8,824,978 B2 | * | 9/2014 | Briffa | H03F 1/32 330/124 R |
| 9,301,046 B1 | * | 3/2016 | Das | H04R 3/04 |
| 9,419,567 B2 | * | 8/2016 | Ripley | H03F 3/21 |
| 9,531,270 B2 | * | 12/2016 | Shi | H02J 7/0068 |

(Continued)

FOREIGN PATENT DOCUMENTS

| | | |
|---|---|---|
| CN | 103597741 A | 2/2014 |
| CN | 103916093 A | 7/2014 |

(Continued)

*Primary Examiner* — Md Talukder
(74) *Attorney, Agent, or Firm* — Chang & Hale LLP

(57) ABSTRACT

Power amplification system with variable supply voltage. A power amplification system can include a power amplifier and a boost converter configured to provide a supply voltage to the power amplifier. The power amplification system can include a control system configured to provide a boost converter control signal to the boost converter to adjust the supply voltage based on a parameter associated with the power amplifier.

20 Claims, 7 Drawing Sheets

(56) References Cited

U.S. PATENT DOCUMENTS

| | | | |
|---|---|---|---|
| 9,572,052 B2* | 2/2017 | King | H04B 1/40 |
| 2006/0244534 A1* | 11/2006 | Whittaker | H03F 1/0211 |
| | | | 330/285 |
| 2006/0246857 A1* | 11/2006 | Grillo | H03G 1/0088 |
| | | | 455/127.1 |
| 2007/0015475 A1* | 1/2007 | Schoofs | H03F 1/0205 |
| | | | 455/127.1 |
| 2008/0297254 A1* | 12/2008 | Chang | H03F 3/3022 |
| | | | 330/264 |
| 2009/0130988 A1* | 5/2009 | Goldberg | H04W 52/52 |
| | | | 455/73 |
| 2009/0237064 A1* | 9/2009 | Vigelius | H02M 3/156 |
| | | | 323/350 |
| 2011/0127954 A1* | 6/2011 | Walley | H01M 2/0267 |
| | | | 320/108 |
| 2012/0133634 A1* | 5/2012 | Her | H03F 1/0211 |
| | | | 345/212 |
| 2013/0027129 A1* | 1/2013 | Langer | H04B 1/0458 |
| | | | 330/127 |
| 2013/0076323 A1* | 3/2013 | Huang | G05F 1/46 |
| | | | 323/274 |
| 2013/0127548 A1 | 5/2013 | Popplewell et al. | |
| 2013/0207731 A1* | 8/2013 | Balteanu | H03F 1/02 |
| | | | 330/296 |
| 2013/0217345 A1* | 8/2013 | Balteanu | H03F 1/02 |
| | | | 455/84 |
| 2014/0057684 A1* | 2/2014 | Khlat | H04W 52/0209 |
| | | | 455/574 |
| 2014/0187182 A1 | 7/2014 | Yan | |
| 2014/0273897 A1* | 9/2014 | Drogi | H04B 1/0458 |
| | | | 455/127.3 |
| 2016/0241197 A1* | 8/2016 | Pehlke | H03F 3/211 |
| 2016/0241208 A1* | 8/2016 | Lehtola | H03F 1/565 |

FOREIGN PATENT DOCUMENTS

| | | |
|---|---|---|
| JP | 06196955 A | 7/1994 |
| JP | 2002314345 A | 10/2002 |
| JP | 2007019585 A | 1/2007 |
| JP | 2009100197 A | 5/2009 |
| JP | 2011130257 A | 6/2011 |
| JP | 2012015791 A | 1/2012 |
| KR | 2003-0086620 A | 11/2003 |
| KR | 2007-0060786 | 6/2007 |
| TW | 201222186 A1 | 6/2012 |
| TW | 201414190 A | 4/2014 |
| TW | 201503577 A | 1/2015 |
| WO | 2004027990 A1 | 4/2004 |
| WO | 2007129716 A1 | 11/2007 |

* cited by examiner

POWER AMPLIFICATION SYSTEM WITH VARIABLE SUPPLY VOLTAGE

CROSS-REFERENCE TO RELATED APPLICATION(S)

This application claims priority to U.S. Provisional Application No. 62/116,459 filed Feb. 15, 2015, entitled PROGRAMMABLE POWER AMPLIFIER PERFORMANCE USING BOOSTED SUPPLY, the disclosure of which is hereby expressly incorporated by reference herein in its entirety.

BACKGROUND

Field

The present disclosure generally relates to power amplification systems.

Description of the Related Art

A power amplification system can be powered by a voltage supply system that provides a supply voltage. The supply voltage can be derived from and different from a battery voltage supplied to the voltage supply system. Ideally, a power amplifier supply voltage should follow the average output power over, for example, a 20 dB window from roughly 10 volts (V) down to 1 V. Given a nominal battery voltage (Vbatt) of approximately 3.8 V, a boost function can be utilized to generate a supply voltage greater than Vbatt, and a buck function can be utilized to generate a supply voltage less than Vbatt.

SUMMARY

In accordance with some implementations, the present disclosure relates to a power amplification system. The power amplification system includes a power amplifier and a boost converter configured to provide a supply voltage to the power amplifier. The power amplification system includes a control system configured to provide a boost converter control signal to the boost converter to adjust the supply voltage based on a parameter associated with the power amplifier.

In some embodiments, the parameter can include a sensed condition of the power amplifier. In some embodiments, the control system can be configured to detect the sensed condition of the power amplifier. In some embodiments, the control system can be configured to receive a signal indicative of the sensed condition of the power amplifier. In some embodiments, the control system can be configured to receive a signal based on the sensed condition of the power amplifier.

In some embodiments, the boost converter control signal can include at least one of a reference voltage, a delta signal, or an enable signal. In some embodiments, in response to an increased reference voltage, the boost converter can be configured to adjust the supply voltage by increasing the supply voltage. In some embodiments, increasing the supply voltage can provide additional headroom for the power amplifier. In some embodiments, in response to the delta signal, the boost converter can be configured to adjust the supply voltage by increasing the supply voltage a preset amount.

In some embodiments, the control system can be further configured to provide a power amplifier control signal to the power amplifier. In some embodiments, the power amplifier control signal can include at least one of a bias voltage or an enable signal.

In some embodiments, the parameter can include an operating mode of the power amplifier and the boost converter control signal can be provided to the boost converter to support the operating mode. In some embodiments, the operating mode can include an increased linearity mode. In some embodiments, the increased linearity mode can be at least one of a high-voltage mode or high output power mode.

In some embodiments, the boost converter can be powered by a battery voltage and the supply voltage can be greater than the battery voltage.

In some implementations, the present disclosure relates to a radio-frequency (RF) module including a packaging substrate configured to receive a plurality of components. The RF module includes a power amplification system implemented on the packaging substrate. The power amplification system includes a power amplifier and a boost converter configured to provide a supply voltage to the power amplifier. The power amplification system further includes a control system configured to provide a boost converter control signal to the boost converter to adjust the supply voltage based on a parameter associated with the power amplifier.

In some embodiments, the RF module can be a front-end module (FEM).

In some implementations, the present disclosure relates to a wireless device including a transceiver configured to generate a radio-frequency (RF) signal. The wireless device includes a front-end module (FEM) in communication with the transceiver. The FEM includes a packaging substrate configured to receive a plurality of components. The FEM includes a power amplification system implemented on the packaging substrate. The power amplification system includes a power amplifier configured to amplify the RF signal. The power amplification system further includes a boost converter configured to provide a supply voltage to the power amplifier. The power amplification system further includes a control system configured to provide a boost converter control signal to the boost converter to adjust the supply voltage based on a parameter associated with the power amplifier. The wireless device includes an antenna in communication with the FEM. The antenna is configured to transmit the amplified RF signal.

In some embodiments, the control system can be configured to detect a sensed condition of the power amplifier and generate the boost converter control signal based on the sensed condition.

In some embodiments, the transceiver can be configured to receive a signal indicative of a sensed condition of the power amplifier and transmit a transceiver control signal based on the sensed condition to the control system. The control system can be configured to generate the boost converter control signal based on the transceiver control signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
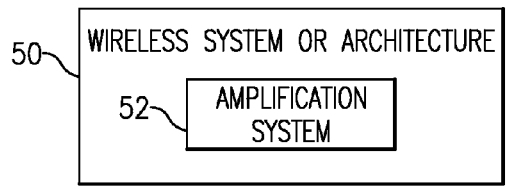
FIG. 1 shows an example wireless system or architecture.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
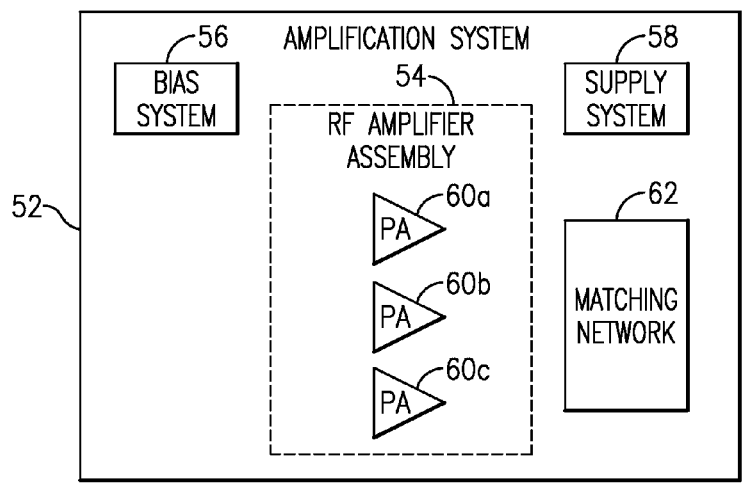
FIG. 2 shows that, in some implementations, an amplification system can include a radio-frequency (RF) amplifier assembly having one or more power amplifiers.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figures 3A, 3B, 3C:
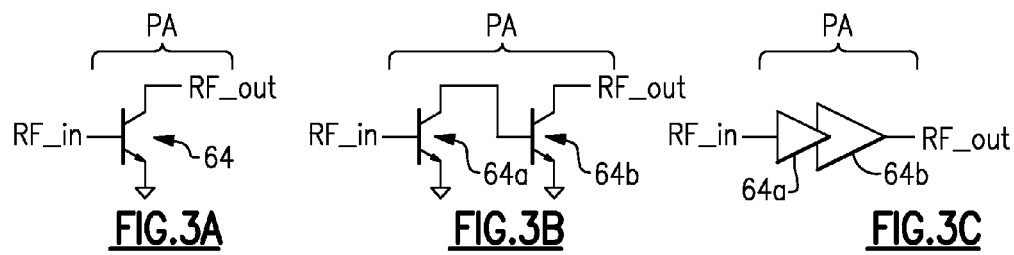
FIGS. 3A-3E show non-limiting examples of power amplifiers.

For the purpose of description, it will be understood that each PA (60) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figures 3D, 3E:
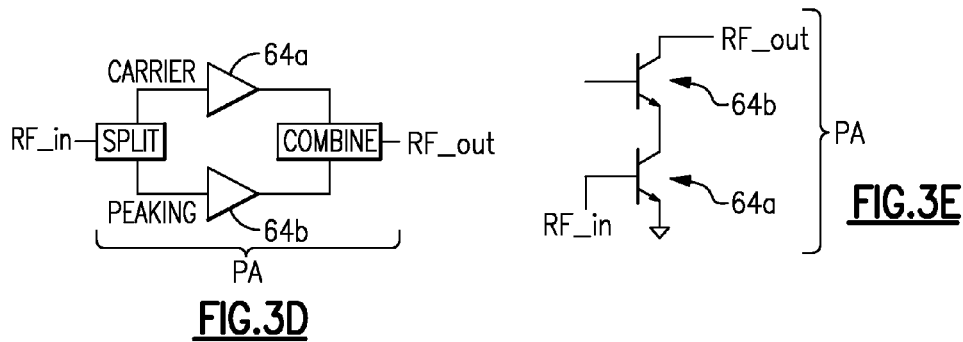

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
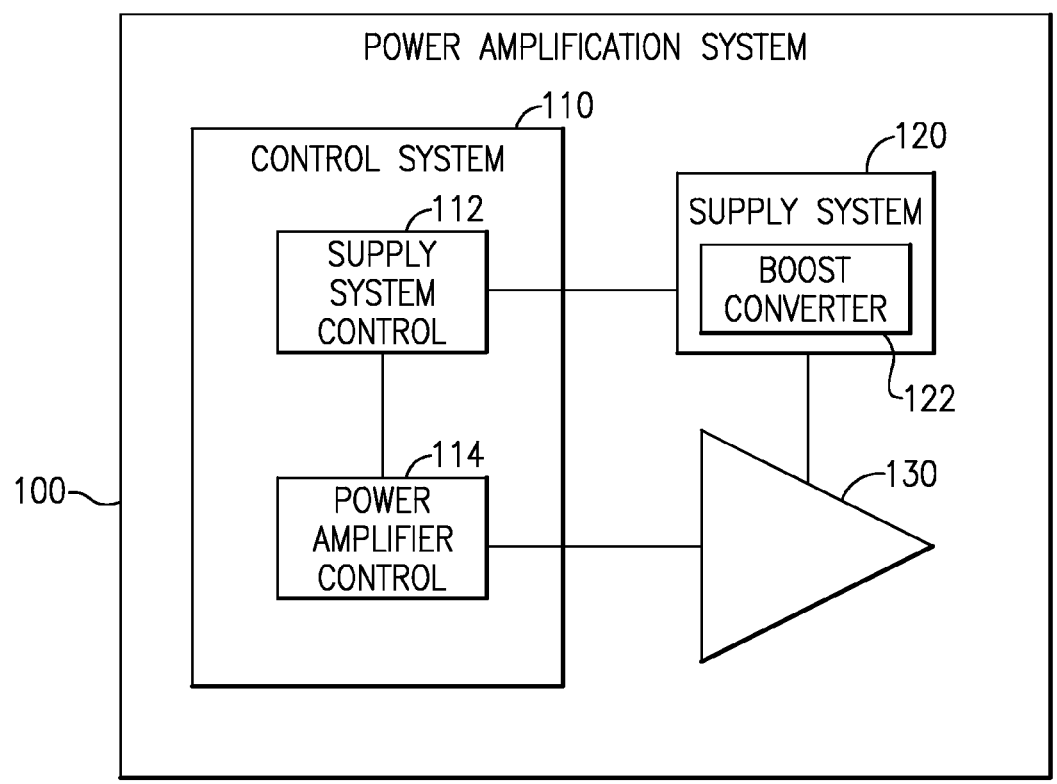
FIG. 4 illustrates a block diagram of a power amplification system including a boost converter.

FIG. 4 illustrates a block diagram of a power amplification system 100 including a boost converter 122. In some embodiments, such a power amplification system can include high-voltage (HV) amplification capability. The power amplification system includes a power amplifier 130 and a supply system 120 configured to provide a supply voltage to the power amplifier 130. The power amplifier 130 is configured to receive an input radio-frequency signal and output, as an output radio-frequency signal, an amplified version of the input radio-frequency signal. The supply system 120 is configured to receive a battery voltage (Vbatt) and output a supply voltage (Vcc) to power the power amplifier 130. The supply system 120 can include, for example, a switching mode power supply (SMPS). The supply system 120 includes a boost converter 122 that can be used to generate a supply voltage greater than (or equal to) the battery voltage. In some implementations, the supply system 120 further includes other components that can be used to, for example, generate a supply voltage less than the battery voltage.

The supply system 120 and power amplifier 130 are controlled by a control system 110 that includes a supply system control component 112 and a power amplifier control component 114. The control system 110 (e.g., the supply system control component 112) is configured to provide a supply system control signal to the supply system to adjust the supply voltage based on a parameter associated with the power amplifier 130. In particular, the control system 110 is configured to provide a boost converter control signal to the boost converter 122 to adjust the supply voltage based on a parameter associated with the power amplifier 130.

The boost converter control signal can be a reference voltage, a delta signal, an enable signal, or any other digital or analog signal. For example, the boost converter control signal can be a reference voltage. In response to an increased reference voltage, the boost converter 122 can be configured to adjust the supply voltage by increasing the supply voltage. Increasing the supply voltage can provide additional headroom for the power amplifier 130. Similarly, in response to a decreased reference voltage, the boost converter 122 can be configured to adjust the supply voltage by decreasing the supply voltage. Decreasing the supply voltage can improve the power-added efficiency (PAE) of the power amplifier 130.

As another example, the boost converter control signal can be a delta signal. In response to the delta signal, the boost converter 122 can be configured to adjust the supply voltage by increasing the supply voltage a preset amount.

In some implementations, the parameter associated with the power amplifier 130 includes a sensed condition of the power amplifier 130. In some implementations, the power amplifier control component 114 (and, thus, the control system 110) is configured to detect the sensed condition of the power amplifier. In some implementations, the control system 110 is configured to receive a signal indicative of the sensed condition of the power amplifier 130. For example, the supply system control component 112 can receive a signal from the power amplifier control component 114 indicative of the sensed condition of the power amplifier. As another example, the control system 110 can receive a signal from a transceiver indicative of the sensed condition of the power amplifier. In some implementations, the control system 110 is configured to receive a signal based on the sensed condition of the power amplifier 130.

The sensed condition of the power amplifier can be, for example, a saturation condition of the power amplifier 130. The power amplifier 130 (or one or more transistors of the power amplifier 130) can be saturated, reducing the linearity of the power amplifier.

In some implementations, the parameter associated with the power amplifier 130 includes an operating mode of the power amplifier 130 and the boost converter control signal is provided to the boost converter 122 to support the operating mode. For example, the operating mode can be an increased linearity mode. The increased linearity mode can be a high-voltage mode or a high output power mode.

The control system 110 (e.g., the power amplifier control component 114) is configured to provide a power amplifier control signal to the power amplifier 130. The power amplifier control signal can be a bias signal (e.g., a bias voltage or a bias current) for biasing the power amplifier 130 (or one or more transistors of the power amplifier 130), an enable signal, or any other digital or analog signal.

Power amplification systems (such as the power amplification system 100 of FIG. 4) having a capability to boost an input voltage (e.g., a battery voltage supplied by a battery) can provide flexibility in how such boosted supply can be utilized. In some embodiments, such a boosted supply voltage can be variable, depending on a control input such as a reference voltage (Vref). Accordingly, one can utilize such a variable nature of the boosted supply voltage in a number of ways, including implementation of a programmable supply voltage.

Figure 5:
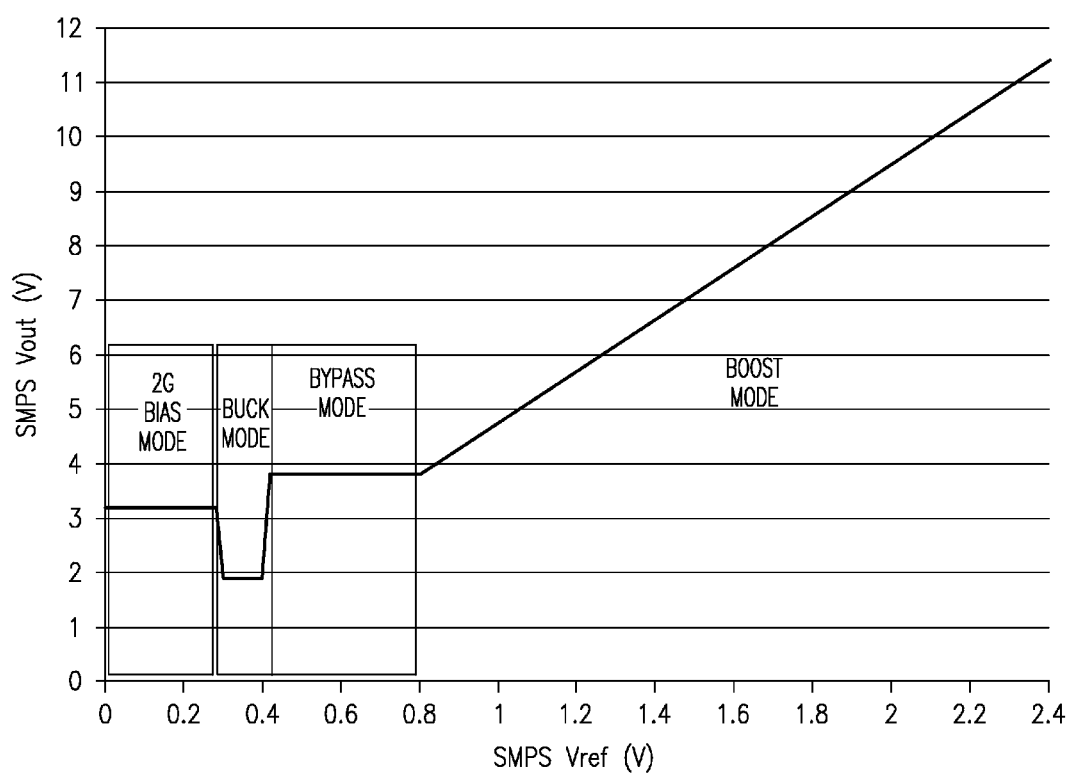
FIG. 5 shows an example of how a boosted output voltage from an SMPS boost converter can be proportional to a reference voltage.

FIG. 5 shows an example of how a boosted output voltage Vout from an SMPS boost converter can be proportional to a reference voltage Vref. One can see that there is a wide range of Vout (e.g., from battery voltage Vbatt to at least 11V in the example shown) that can be utilized. For example, there can be a wide range of supply voltage Vcc provided to a power amplifier (e.g., the collector of a transistor of the power amplifier).

Additional examples related to the generation of variable Vout are described in U.S. patent application Ser. No. 14/867,186, entitled VOLTAGE SUPPLY SYSTEM WITH BOOST CONVERTER AND CHARGE PUMP, filed on Sep. 28, 2015, and hereby incorporated by reference herein in its entirety, which claims the benefit of U.S. Provisional Application No. 62/116,458 filed Feb. 15, 2015, entitled DEVICES AND METHODS RELATED TO MULTI-MODE POWER MANAGEMENT, the disclosure of which is also hereby expressly incorporated by reference herein in its entirety.

In the above-referenced application, the example Vout profile, including the boost mode portion, can be obtained by a control system that does not necessarily involve control (e.g., from a transceiver) external to the power amplification system. However, for the purpose of description herein, it will be understood that controlling the variable boosted output Vout may or may not involve external control features.

With the foregoing capability to provide a wide range of supply voltage from a boost converter, one can utilize such capability to obtain beneficial power amplifier performance improvements. Linearity is an example of such a power amplifier performance. Although various examples are described herein in the context of linearity, it will be understood that other power amplifier related performance can be adjusted utilizing the variable nature of the supply voltage.

It is noted that power amplifier non-linearity is often limited by amplitude modulation compression determined by the available level of the collector/drain voltage supply. Such amplitude modulation compression can impact other parameters such as in-band error vector magnitude (EVM) and spectral regrowth adjacent channel leakage ratio (ACLR) linearity performance required for radio conformance, and can even impact receiver sensitivity if a duplex gap is sufficiently small.

Figure 6:
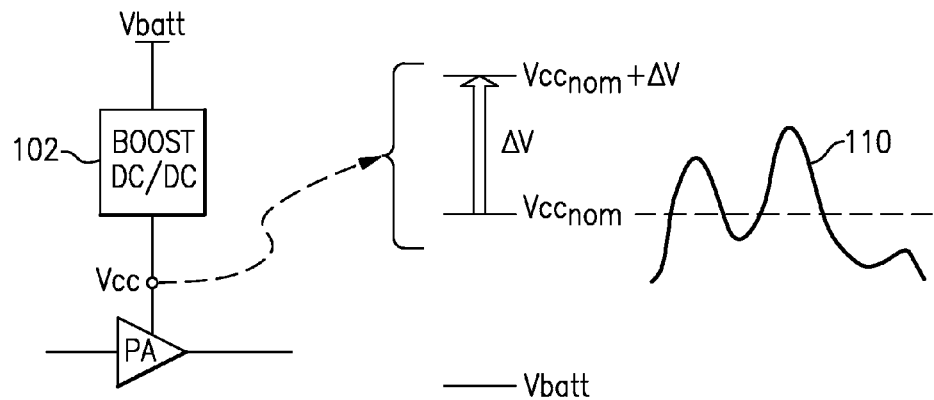
FIG. 6 shows an example of how a collector supply voltage limitation can be removed or substantially loosened with a variable supply voltage from a boost converter.

FIG. 6 shows an example of how the foregoing collector supply voltage limitation can be removed or substantially loosened with a variable supply voltage from a boost converter 102. Such a boost converter is shown to generate and provide a supply voltage Vcc to a power amplifier, to thereby allow the power amplifier to be operated with improved linearity.

For example, with the boost converter 102, a nominal optimal value $Vcc_{nom}$ can be provided to the power amplifier to achieve a given level of linearity. However, when additional linearity is desired (e.g., with large envelope (110) amplitudes), setting a higher supply voltage level provides more headroom, and therefore better linearity. Such an increase in headroom can result in may result in degradation of DC consumption and efficiency performance; however, such sacrifice are only suffered in operating situations involving higher level of emission and linearity performance.

In the example of FIG. 6, the foregoing increased headroom can be achieved by increasing the Vcc from the nominal value $Vcc_{nom}$ by an amount $\Delta V$ so as to yield an increased supply voltage $Vcc_{nom}+\Delta V$. The increased amount $\Delta V$ can be selected to accommodate high emission levels as depicted by the example envelope 110. In some embodiments, operations related to the generation of Vcc by the boost converter can be programmed with respect to values associated with either or both of $Vcc_{nom}$ and $\Delta V$.

The foregoing example where Vcc can be increased by programmed operation of the boost converter is an example of a more general concept in which the output of a boost converter can be adjusted based on some power amplifier related parameter.

Figure 7:
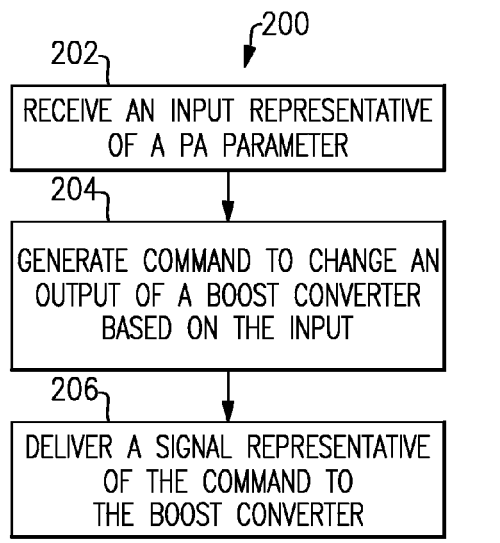
FIG. 7 shows a process that can be implemented to operate a boost converter to achieve a desired result for a corresponding power amplifier.

FIG. 7 shows a process 200 that can be implemented to operate such a boost converter to achieve a desired result for a corresponding power amplifier. In block 202, an input representative of a power amplifier parameter can be received. In block 204, a command to change an output of a boost converter can generated based on the input. In block 206, a signal representative of the command can be delivered to the boost converter to adjust its output.

Figure 8:
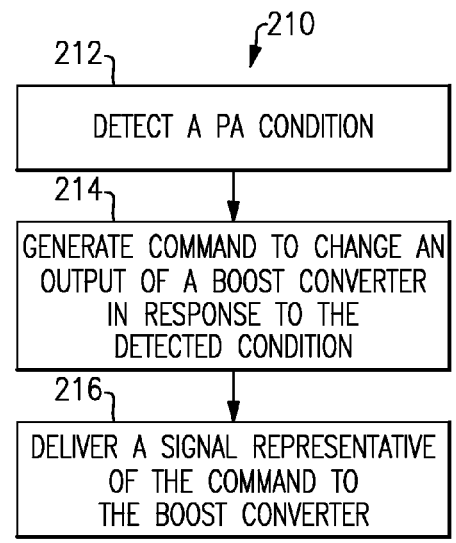
FIG. 8 shows a process that can be implemented to effectuate a response to a sensed power amplifier condition.

In some embodiments, the foregoing process can be implemented to allow a boost converter to respond to some sensed power amplifier condition. FIG. 8 shows a process 210 that can be implemented to effectuate such a response. In block 212, a power amplifier condition can be detected. In block 214, a command can be generated to change an output of a boost converter in response to the detected condition. In block 216, a signal representative of the command can be delivered to the boost converter to adjust its output.

Among others, examples related to the foregoing response of the boost converter to some sensed power amplifier condition are described in U.S. patent application Ser. No. 14/867,264, entitled COMPRESSION CONTROL THROUGH POWER AMPLIFIER VOLTAGE ADJUSTMENT, filed on Sep. 28, 2015, and hereby incorporated by reference herein in their entirety, which claims the benefit of U.S. Provisional Application No. U.S. Provisional Application No. 62/097,941 filed Dec. 30, 2014, entitled COMPRESSION CONTROL THROUGH POWER AMPLIFIER VOLTAGE ADJUSTMENT, the disclosure of which is also hereby expressly incorporated by reference herein in its entirety.

Figure 9:
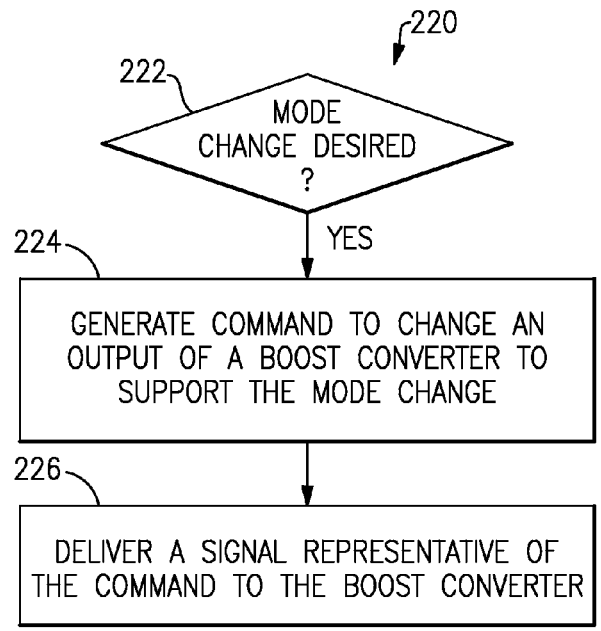
FIG. 9 shows a process that can be implemented as a more specific example of the process of FIG. 7.

FIG. 9 shows a process 220 that can be implemented as a more specific example of the process 200 of FIG. 7. In the process 220 of FIG. 9, operation of a boost converter is not necessarily responding automatically to some input. Rather, a change in the boost converter's output is being implemented as, for example, a programmed change. In a decision block 222, the process 220 can determine whether a mode change is desired. If Yes, the process 220 in block 224 can generate a command to change an output of a boost converter to support the mode change. In block 226, a signal representative of the command can be delivered to the boost converter to adjust its output.

Figure 10:
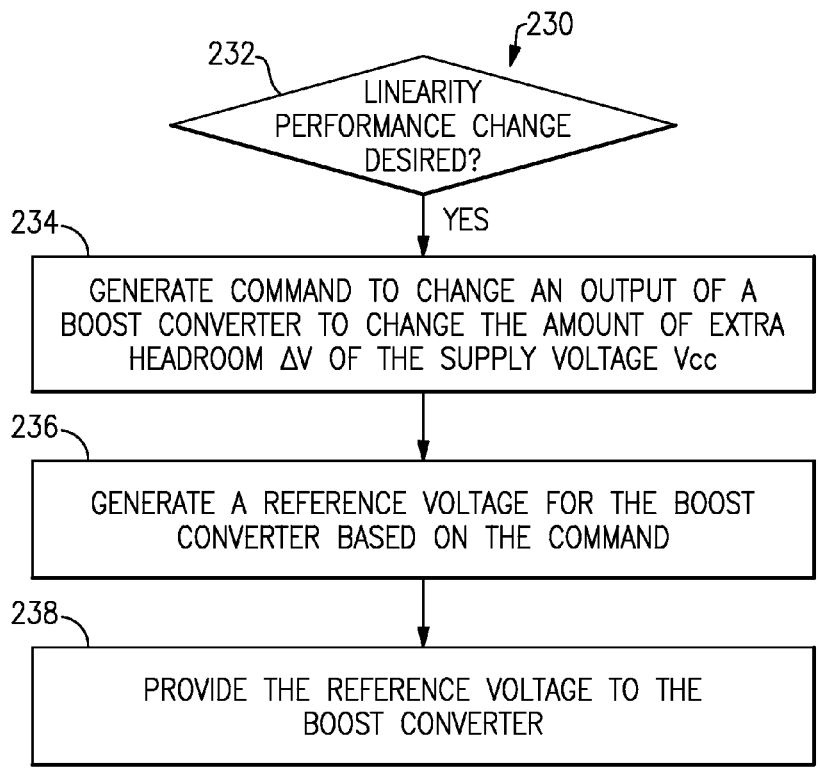
FIG. 10 shows a process that can be implemented as a more specific example of the process of FIG. 9, in the example context of linearity control.

FIG. 10 shows a process 230 that can be implemented as a more specific example of the process 220 of FIG. 9, in the example context of linearity control. In a decision block 232, the process 230 can determine whether a linearity performance change is desired. If Yes, the process 230 in block 234 can generate a command to change an output of a boost converter to change the amount of extra headroom $\Delta V$ of the supply voltage Vcc. In block 236, a reference voltage can be generated for the boost converter based on the command. In block 238, the reference voltage can be provided to the boost converter to adjust its output.

In some embodiments, some or all of the example processes described in reference to FIGS. 7-10 can be performed and/or facilitated by the control system (e.g., 110 in FIG. 4).

Figure 11:
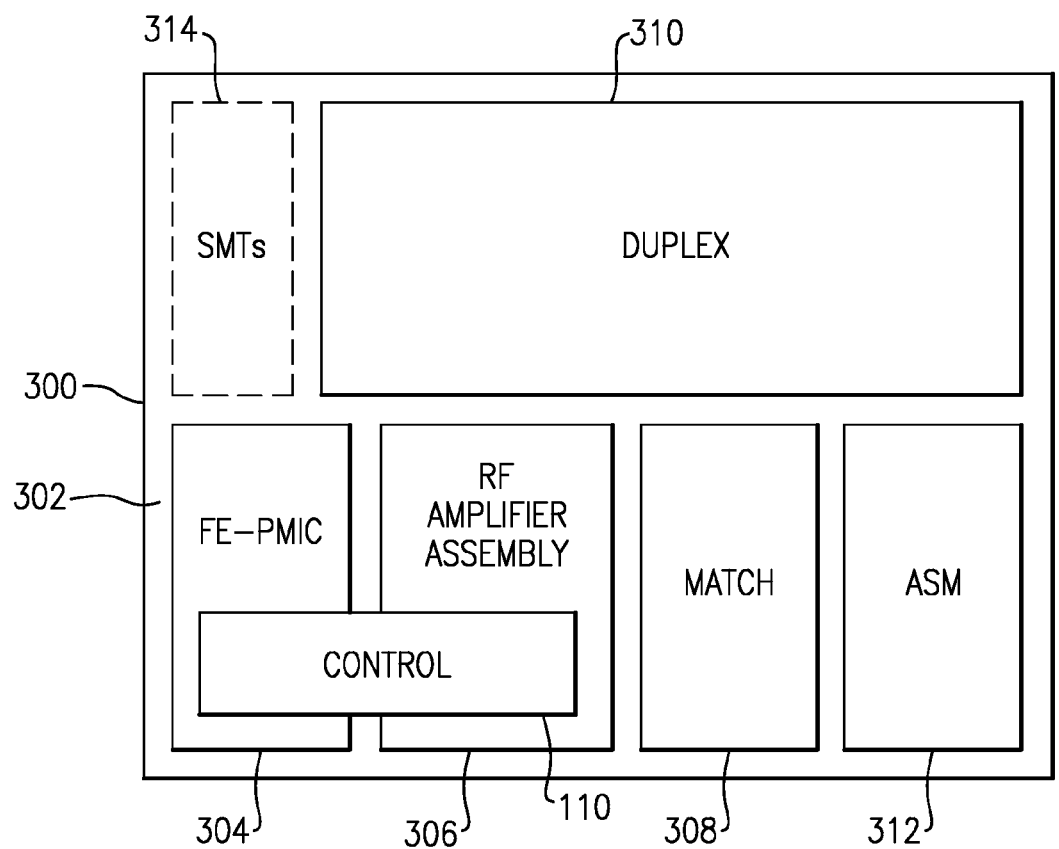
FIG. 11 depicts a module having one or more features as described herein.

FIG. 11 shows that in some embodiments, some or all of the boost converter related functionalities described herein can be implemented in a module. Such a module can be, for example, a front-end module (FEM). In the example of FIG. 11, a module 300 can include a packaging substrate 302, and a number of components can be mounted on such a packaging substrate. For example, an FE-PMIC component 304, a power amplifier assembly 306, a match component 308, and a duplexer assembly 310 can be mounted and/or implemented on and/or within the packaging substrate 302. Other components such as a number of SMT devices 314 and an antenna switch module (ASM) 312 can also be mounted on the packaging substrate 302. A control system 104 having one or more features as described herein can be implemented as part of either or both of the FE-PMIC component 304 and the power amplifier assembly 306. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 12:
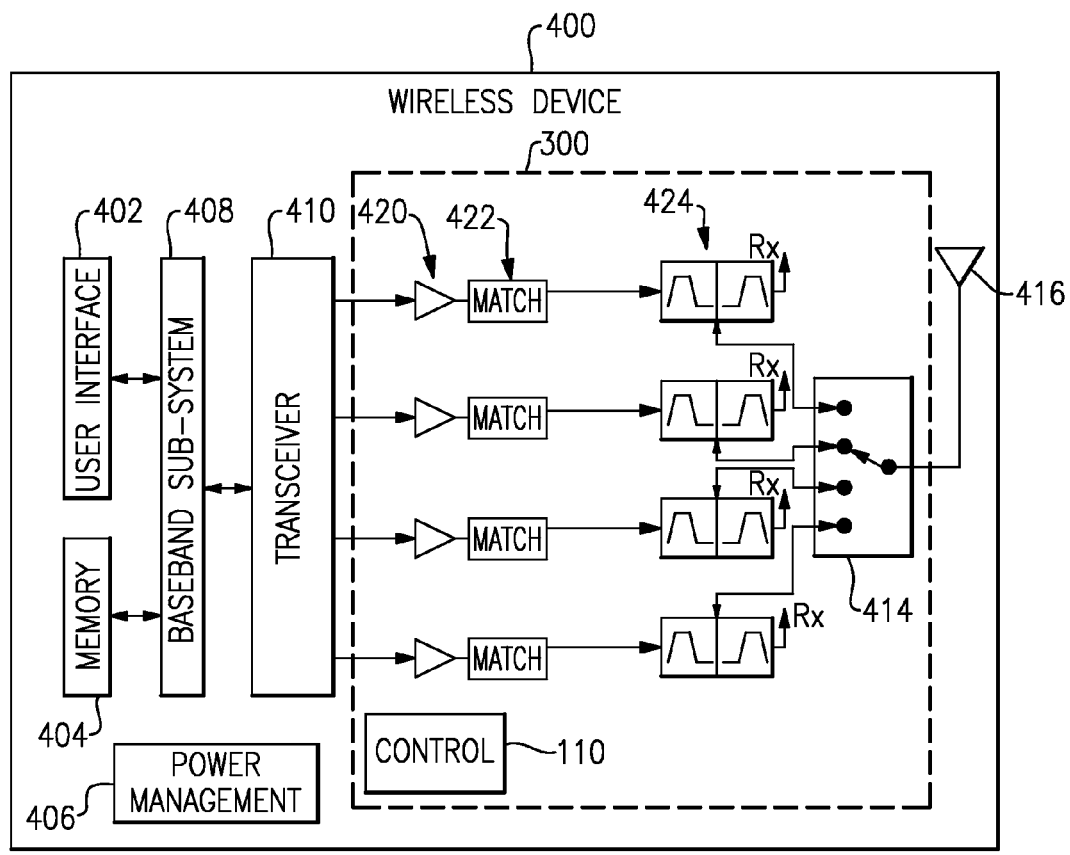
FIG. 12 depicts a wireless device having one or more features described herein.

FIG. 12 depicts an example wireless device 400 having one or more advantageous features described herein. In the context of a module having one or more features as described herein, such a module can be generally depicted by a dashed box 300, and can be implemented as, for example, a front-end module (FEM). Such a module can include control system 104 having one or more features as described herein.

Referring to FIG. 12, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 420. Such amplified and filtered signals can be routed to an antenna 416 through an antenna switch 414 for transmission. In some embodiments, the duplexers 420 can allow transmit and receive operations to be performed simultaneously using a common antenna (e.g., 416). In FIG. 12, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
   a power amplifier;
   a boost converter coupled to the power amplifier, the boost converter configured to provide a supply voltage to the power amplifier from a set of supply voltages including a first supply voltage and a second supply voltage; and
   a control system coupled to the power amplifier and the boost converter, the control system configured to provide a boost converter control signal to the boost converter, the boost converter control signal including a reference voltage from a set of reference voltages including a first reference voltage to select the first supply voltage and a second reference voltage to select the second supply voltage based on a parameter associated with the power amplifier, the second supply voltage being a preset amount greater than the first supply voltage.

2. The power amplification system of claim 1 wherein the parameter associated with the power amplifier includes a sensed condition of the power amplifier.

3. The power amplification system of claim 2 wherein the control system is configured to detect the sensed condition of the power amplifier.

4. The power amplification system of claim 2 wherein the control system is configured to receive a signal indicative of the sensed condition of the power amplifier.

5. The power amplification system of claim 2 wherein the sensed condition of the power amplifier is indicative of one or more transistors of the power amplifier being saturated.

6. The power amplification system of claim 1 wherein the boost converter control signal includes a digital delta signal to select the second supply voltage.

7. The power amplification system of claim 1 wherein the second supply voltage provides additional headroom for the power amplifier.

8. The power amplification system of claim 1 wherein the control system is further configured to provide a power amplifier control signal to the power amplifier.

9. The power amplification system of claim 8 wherein the power amplifier control signal includes at least one of a bias voltage or an enable signal.

10. The power amplification system of claim 1 wherein the parameter associated with the power amplifier includes an operating mode of the power amplifier and the boost converter control signal is provided to the boost converter to support the operating mode.

11. The power amplification system of claim 10 wherein the operating mode includes an increased linearity mode.

12. The power amplification system of claim 11 wherein the increased linearity mode is at least one of a high-voltage mode or high output power mode.

13. The power amplification system of claim 1 wherein the boost converter is powered by a battery voltage and the second supply voltage is greater than the battery voltage.

14. A radio-frequency module comprising:
    a packaging substrate configured to receive a plurality of components; and
    a power amplification system implemented on the packaging substrate, the power amplification system including a power amplifier and a boost converter coupled to the power amplifier, the boost converter configured to provide a supply voltage to the power amplifier from a set of supply voltages including a first supply voltage and a second supply voltage, the power amplification system further including a control system coupled to the power amplifier and the boost converter, the control system configured to provide a boost converter control signal to the boost converter, the boost converter control signal including a reference voltage from a set of reference voltages including a first reference voltage to select the first supply voltage and a second reference voltage to select the second supply voltage based on a parameter associated with the power amplifier, the second supply voltage being a preset amount greater than the first supply voltage.

15. The radio-frequency module of claim 14 wherein the radio-frequency module is a front-end module.

16. A wireless device comprising:
    a transceiver configured to generate a radio-frequency signal;
    a front-end module in communication with the transceiver, the front-end module including a packaging substrate configured to receive a plurality of components, the front-end module further including a power amplification system implemented on the packaging substrate, the power amplification system including a power amplifier configured to amplify the radio-frequency signal, the power amplification system further including a boost converter coupled to the power amplifier, the boost converter configured to provide a supply voltage to the power amplifier from a set of supply voltages including a first supply voltage and a second supply voltage, the power amplification system further including a control system coupled to the power amplifier and the boost converter, the control system configured to provide a boost converter control signal to the boost converter, the boost converter control signal including a reference voltage from a set of reference voltages including a first reference voltage to select the first supply voltage and a second reference voltage to select the second supply voltage based on a parameter associated with the power amplifier, the second supply voltage being a preset amount greater than the first supply voltage; and an antenna in communication with the front-end module, the antenna being configured to transmit the amplified radio-frequency signal.

17. The wireless device of claim 16 wherein the control system is configured to detect a sensed condition of the power amplifier and generate the boost converter control signal based on the sensed condition.

18. The wireless device of claim 16 wherein the transceiver is configured to receive a signal indicative of a sensed condition of the power amplifier and transmit a transceiver control signal based on the sensed condition to the control system, the control system being configured to generate the boost converter control signal based on the transceiver control signal.

19. The wireless device of claim 17 wherein the sensed condition of the power amplifier is indicative of one or more transistors of the power amplifier being saturated.

20. The wireless device of claim 17 wherein the second supply voltage provides additional headroom for the power amplifier.

* * * * *